(12) United States Patent
Prakash et al.

(10) Patent No.: US 9,105,327 B2
(45) Date of Patent: Aug. 11, 2015

(54) MEMORY CONTROLLER USING A DATA STROBE SIGNAL AND METHOD OF CALIBRATING DATA STROBE SIGNAL IN A MEMORY CONTROLLER

(71) Applicant: ARM Limited, Cambridge (GB)

(72) Inventors: Gyan Prakash, Bangalore (IN); Ranabir Dey, Agartala (IN); Nidhir Kumar, Bangalore (IN)

(73) Assignee: ARM Limited, Cambridge (GB)

( * ) Notice: Subject to any disclaimer, the term of this patent is extended or adjusted under 35 U.S.C. 154(b) by 231 days.

(21) Appl. No.: 13/861,641

(22) Filed: Apr. 12, 2013

(65) Prior Publication Data

US 2014/0307514 A1    Oct. 16, 2014

(51) Int. Cl.
*G11C 7/22* (2006.01)

(52) U.S. Cl.
CPC ...................... *G11C 7/222* (2013.01)

(58) Field of Classification Search
CPC ...... G11C 7/22; G11C 7/1051; G11C 7/1066; G11C 7/1072; G11C 7/1078
USPC .............. 365/189.11, 191, 193, 194
See application file for complete search history.

(56) References Cited

U.S. PATENT DOCUMENTS

| | | | |
|---|---|---|---|
| 7,036,053 B2 | 4/2006 | Zumkehr et al. | |
| 7,111,111 B2 | 9/2006 | Neuman et al. | |
| 7,165,185 B2 | 1/2007 | Li et al. | |
| 7,499,368 B2 | 3/2009 | Rao et al. | |
| 7,886,174 B2 | 2/2011 | Spry et al. | |
| 8,037,375 B2 | 10/2011 | Schaefer | |
| 8,121,237 B2 | 2/2012 | Stott et al. | |
| 8,295,118 B2 | 10/2012 | Best et al. | |
| 2006/0203602 A1* | 9/2006 | Best et al. | 365/233 |
| 2007/0002642 A1* | 1/2007 | Butt et al. | 365/193 |
| 2008/0276133 A1 | 11/2008 | Hadley et al. | |
| 2009/0021998 A1* | 1/2009 | Millar et al. | 365/193 |
| 2010/0246290 A1 | 9/2010 | Maclaren et al. | |
| 2011/0040902 A1 | 2/2011 | Housty | |
| 2011/0078370 A1 | 3/2011 | Chaudhuri et al. | |

(Continued)

OTHER PUBLICATIONS

Notice of Allowance mailed Oct. 8, 2014 in co-pending U.S. Appl. No. 13/726,395.

(Continued)

*Primary Examiner* — Thao H Bui
(74) *Attorney, Agent, or Firm* — Pramudji Law Group PLLC; Ari Pramudji

(57) ABSTRACT

A memory controller and a method of calibrating the memory controller are provided. Input circuitry in the memory controller receives a differential pair of data strobe signals from a memory and generates a logical data strobe signal in dependence on a voltage difference between the differential pair of data strobe signals. Hysteresis circuitry, when active, increases by a predetermined offset a threshold voltage difference at which the input circuitry changes a logical state of the logical data strobe signal. Gate signal generation circuitry generates a data strobe gating signal, wherein the memory controller interprets the logical data strobe signal as valid when the data strobe gating signal is asserted. The memory controller performs a training process to determine a timing offset for the data strobe gating signal with respect to said logical data strobe signal, wherein the training process provides a first phase in which the hysteresis circuitry is active and a second phase in which the hysteresis circuitry is inactive.

20 Claims, 10 Drawing Sheets

(56) References Cited

U.S. PATENT DOCUMENTS

2011/0128793 A1 6/2011 Venkataraman et al.
2011/0158020 A1 6/2011 Hwang

OTHER PUBLICATIONS

Office Action mailed Sep. 16, 2014 in co-pending U.S. Appl. No. 13/854,226.
"JESD79-3F (Revision of JESD79-3E, Jul. 2010)", DDR3 SDRAM Standard, (Jul. 2012), 226 pages.
Nidhir Kumar et al., U.S. Appl. No. 13/726,395, filed Dec. 24, 2012.
Nidhir Kumar et al., U.S. Appl. No. 13/726,392, filed Dec. 24, 2012.
Nidhir Kumar et al., U.S. Appl. No. 13/726,383, filed Dec. 24, 2012.
Nidhir Kumar et al., U.S. Appl. No. 13/854,226, filed Apr. 1, 2013.
Notice of Allowance mailed Mar. 11, 2014 in co-pending U.S. Appl. No. 13/726,392.
P. Fleming et al, "Algorithm for Adjustment of DDR Write Interface Timing" ISSC 2008, Jun. 2008, pp. 144-148.

\* cited by examiner

MEMORY CONTROLLER USING A DATA STROBE SIGNAL AND METHOD OF CALIBRATING DATA STROBE SIGNAL IN A MEMORY CONTROLLER

This application incorporates by reference the subject matter disclosed in each of the following US patent applications: "A data signal receiver and method of calibrating a data signal receiver"—U.S. patent application Ser. No. 13/726,395; "A method and apparatus for aligning a clock signal and a data strobe signal in a memory system"—U.S. patent application Ser. No. 13/726,392; "An interface for controlling the phase alignment of clock signals for a recipient device"—U.S. patent application Ser. No. 13/726,383; and "A memory controller and method of calibrating a memory controller"—U.S. patent application Ser. No. 13/854,226.

BACKGROUND OF THE INVENTION

1. Field of the Invention

The present invention relates to a memory controller. More particularly, this invention relates to the calibration of a memory controller which is configured to receive a data strobe signal from a memory.

2. Background

It is known to provide a memory controller which is configured to control memory accesses to a memory device, wherein the memory controller and memory device can exchange a data strobe signal which accompanies a data signal transmitted as part of those memory accesses and indicates the points at which those data signals should be sampled in order to be correctly interpreted. When non active the data strobe signal line (or rather lines since this is typically differential pair of data strobe signals) is/are kept in a high impedance state which allows the data strobe signal line to be driven either by a memory controller or by the memory device as required. During a read memory access, the data strobe signal line is driven by a memory device, preceded by a short preamble before any data is transmitted to allow the opening of a gating signal in the memory controller. This gating signal is generated by the memory controller and the received data strobe signal is only interpreted as valid by the memory controller when the gating signal is asserted. This avoids any stray noise causing the data signal receiver to interpret spurious signals as a valid input.

Accordingly, the timing with which the gating signal is generated with respect to the data strobe signal is vital for the correct reception of data during a memory read access. If the gating signal begins too early then noise on the data strobe signal line could result in incorrect data being interpreted at the receiver. Conversely if the gating signal begins too late then genuine transmitted data will be missed.

As contemporary memory systems progress to higher operating frequencies the inherent system jitter and uncertainties can mean that the setting of the timing of the gating signal is a significant challenge which may require laborious user intervention. For example, in a DDR3 memory system operating at 2133 Mbps, the opening preamble of a data transmission is only 840 ps long, whilst typical DRAM uncertainty is +/−100 ps, with a further removal of 80 ps (in the worst case scenario) leaving only a limited time window in which the opening of the gating signal must be placed.

Accordingly it would be desirable to provide an improved technique for determining the relative timing of the gating signal with respect to the data strobe signal.

SUMMARY

Viewed from a first aspect the present invention provides a memory controller comprising input circuitry configured to receive a differential pair of data strobe signals from a memory, said input circuitry configured to generate a logical data strobe signal in dependence on a voltage difference between said differential pair of data strobe signals;

hysteresis circuitry configured, when switched to an active state, to increase by a predetermined offset a threshold voltage difference at which said input circuitry is configured to change a logical state of said logical data strobe signal; and gate signal generation circuitry configured to generate a data strobe gating signal, wherein said memory controller is configured to interpret said logical data strobe signal as valid when said data strobe gating signal is asserted, wherein said memory controller is configured to perform a training process to determine a timing offset for said data strobe gating signal with respect to said logical data strobe signal, wherein said training process comprises a first phase in which said hysteresis circuitry is in said active state and a second phase in which said hysteresis circuitry is not in said active state.

The present technique recognises that the sensitivity of the memory controller to noise on the data strobe signal line can be reduced by providing hysteresis circuitry which increases the threshold voltage difference at which input circuitry in the memory controller is configured to interpret a voltage difference between a differential pair of data strobe signals as the change over point between two logical states. In other words below this threshold voltage difference between the pair of data strobe signals one logical state is interpreted whilst above this threshold voltage difference the other logical state of the data strobe signal is interpreted. By reducing the sensitivity of the input circuitry of the memory controller to noise on the data strobe signal line in this manner, the need strictly to assert the data strobe gating signal only once the memory is actively driving the differential pair of data strobe signals is reduced and accordingly the narrow time window in which the data strobe gating signal must be asserted before the first valid transition of the data strobe signal occurs is increased.

However, the present technique further recognises that the activation of the hysteresis circuitry will also disturb the phase relationship of the data signal transmitted from the memory and the data strobe signal transmitted from the memory. Accordingly, after a first phase of a training process in which the timing offset for the data strobe gating signal is determined with respect to the data strobe signal, there follows a second phase in which the hysteresis circuitry is switched off. Although switching off the hysteresis circuitry may also disturb the phase relationship of the data strobe gating signal with respect to the data strobe signal, this is only to a minor extent with regard to the gross alignment which can be achieved in the first phase when the hysteresis circuitry is active. Hence, overall by carrying out a training process comprising a first phase in which the hysteresis circuitry is active and a second phase in which the hysteresis circuitry is inactive, an automated calibration procedure for the memory controller to set a timing offset for the data strobe gating signal with respect to the data strobe signal is provided.

The memory controller may further comprise phase detection circuitry configured to determine a time ordering of a first transition of said logical data strobe signal and a first transition of said data strobe gating signal. The first transition of the logical data strobe signal and the first transition of the data strobe gating signal are the significant points in each signal to identify, since these indicate, respectively, the points at which the received data strobe signal begins its active phase and the point after which the data strobe gating signal allows the memory controller to interpret that data strobe signal as valid.

Hence the provision of phase detection circuitry configured to determine a time ordering of these two first transitions enables the memory controller to determine where these two first transitions are with respect to one another and to adapt the timing offset accordingly.

In some embodiments the phase detection circuitry comprises edge generation circuitry, said edge generation circuitry configured to generate an edge signal with a first value before said first transition of said logical data strobe signal and to generate said edge signal with a second value after said first transition of said logical data strobe signal. For the purposes of the timing offset for the data strobe gating signal with respect to the logical data strobe signal, as mentioned above it is the first transition of the (logical) data strobe signal which is significant and indeed it may be preferable to ignore further transitions of the logical data strobe signal to avoid the possibility that the current timing offset for the data strobe gating signal is such that it is in fact closest to a further (non-first) transition of the (logical) data strobe signal, leading to the possibility that the data strobe gating signal could be mistakenly aligned with a transition of the data strobe signal which is not its first transition. Hence the edge generation circuitry which generates a first value before the first transition of the data strobe signal and a second value after the first transition of the data strobe signal provides a clean reference signal with respect to which alignment with the first transition of the data strobe signal may be performed.

In some embodiments the phase detection circuitry is configured to determine said time ordering with reference to said edge signal and said data strobe gating signal. Hence, the above mentioned potential problems of aligning the data strobe gating signal with the wrong transition of the data strobe signal may be avoided.

In some embodiments said memory controller is configured to receive said differential pair of data strobe signals as a sequence of predetermined length, and said memory controller is configured to perform a timing adjustment process comprising instructing said memory to transmit said sequence and adjusting a timing offset for said data strobe gating signal to reduce a time difference between said first transition of said logical data strobe signal and said first transition of said data strobe gating signal, wherein said memory controller is configured to repeat said timing adjustment process until said time ordering inverts. The timing adjustment process is therefore an iterative procedure in which the memory controller instructs the memory to transmit its sequence of predetermined length and by monitoring the time ordering indicated by the phase detection circuitry, the memory controller can adjust the timing offset for the data strobe gating signal so that a time difference between the respective first transitions of the (logical) data strobe signal and the data strobe gating signal can be reduced. This iterative process continues until that time ordering inverts indicating that these two first transitions have (by the timing offset adjustment implemented at the last iteration) reached the point where those first transitions have just passed one another (and by virtue of the fact that each adjustment of the timing offset is small, these first transitions must at this point be very closely aligned).

In some embodiments said memory controller is configured to begin said first phase with said first transition of said data strobe gating signal in advance of said first transition of said logical data strobe signal. Whilst it is in principle possible to begin the training process with any ordering of the data strobe signal and the logical data strobe signal, to then adjust the timing offset to bring the two closer together, beginning the training process with the data strobe gating signal after the first transition of the logical data strobe signal runs the risk, as mentioned above, that a later transition of the data strobe signal could mistakenly be identified as the first transition of the data strobe signal and configured in this way the memory controller would miss real data transmitted by the memory. Accordingly, it is advantageous to begin the first phase of the training process with the first transition of the data strobe gating signal in advance of the first transition of the logical data strobe signal. Further, as explained above, by activating the hysteresis circuitry in this first phase, the risk that noise on the data strobe signal line could be interpreted as a genuine transition of the data strobe signal is greatly reduced, meaning that when first beginning the training process, the data strobe gating signal can be initiated with an initial timing offset comfortably in advance of the data strobe signal facilitating an automated calibration process within the memory controller even at high contemporary frequencies.

In some embodiment, said memory controller is configured to perform said timing adjustment process in said first phase of said training process and said memory controller is configured to adjust said timing offset by incrementing said timing offset for said data strobe gating signal. Thus, in the first phase of the training process the memory controller is configured to adjust the timing offset by simply incrementing the timing offset for the data strobe data signal in a given direction, continuing this process until the time ordering inverts. For example, in one of the above mentioned embodiments in which the first phase is started with the first transition of the data strobe gating signal placed in advanced of the first transition of the logical data strobe signal (because of the greater time window this allows) the memory controller may then be configured to incrementally delay the data strobe gating signal until it is closely aligned with the data strobe signal (identified by the point at which the time ordering inverts).

In some embodiments said memory controller is configured to perform said timing adjustment process in said second phase of said training process and said memory controller is configured to adjust said timing offset by incrementing said timing offset for said data strobe gating signal in a direction dependent on said time ordering. Accordingly, in the second phase of the training process, in which the hysteresis circuitry has been switched off, it may be unknown what effect (in terms of their relative timing) the switching off of the hysteresis circuitry will have had on the data strobe dating signal with respect to the data strobe signal. Hence in this situation, the memory controller can monitor the time ordering indicated by the phase detection circuitry to recognise which direction the timing offset of the data strobe data signal should be adjusted in order to reduce the timing difference between the first transition of the data strobe data signal and the first transition of the data strobe signal.

In some embodiments said memory controller is configured to repeat said second phase for a plurality of iterations and to determine an averaged timing offset in dependence on said timing offset determined at each iteration of said plurality of iterations. Because of inherent system jitter, it may be desirable to not rely on a single iteration of the second phase of the training process to determine the final timing offset to be applied and the jitter effect may be averaged out by determining an averaged timing offset across a number of iterations of the second phase.

In some embodiments the memory controller is configured to receive said differential pair of data strobe signals as a sequence of predetermined length, wherein said sequence comprises a preamble portion, said gate signal generation circuitry is further configured to generate a delayed data strobe gating signal, wherein said memory controller is configured to interpret said logical data strobe signal as valid when said delayed data strobe gating signal is asserted, and said memory controller is configured to determine said timing offset such that a first transition of said delayed data strobe gating signal occurs within said preamble portion. Receiving the differential pair of data strobe signals as sequence of predetermined length having a preamble portion is advantageous because the preamble portion provides a period in which the data strobe signals are being actively driven by the memory thus suppressing spurious system noise which could be wrongly interpreted, and it is then further advantageous for the gate signal generation circuitry to generate two versions of the data strobe gating signal, one delayed with respect to the other, so that the non-delayed version can be used for alignment with the data strobe signal, whilst the delayed data strobe gating signal can be arranged to have its first transition within the preamble portion, meaning that the memory controller will only interpret the data strobe signal as valid whilst the memory is actively driving the data strobe signal line.

In some such embodiments, the sequence may comprise a postamble portion and said gate signal generation circuitry is further configured to generate said delayed data strobe gating signal such that a last transition of said delayed data strobe gating signal is aligned with a start of said postamble portion. The postamble portion indicates the end of the sequence of predetermined length and it is therefore advantageous to generate the delayed data strobe gating signal such that its last transition (i.e. indicating the point after which the delayed data strobe gating signal is not asserted) is aligned with a start of the postamble portion, thus minimising the risk that any noise occurring during the postamble portion or thereafter might be interpreted as indicating valid data is being transmitted.

In some embodiments, to facilitate the identification of the start of the postamble portion, the memory controller is configured to count a number of transitions of said sequence between said preamble portion and said postamble portion.

The timing offset may be provided in a number of ways, but in some embodiments said memory controller further comprises delay circuitry configured to provide said timing offset, said delay circuitry comprising delay-locked loop circuitry. This provides a usefully constrained and controllable mechanism for implementing the timing offset.

In some such embodiments, the delay circuitry further comprises delay step selection circuitry configured to select a delay step for said timing offset from plural delay steps, wherein each delay step of said plural delay steps corresponds to a delay range of said delay-locked loop circuitry. Accordingly, by the combined action of the delay-locked loop circuitry and the delay step selection circuitry, a great range for the timing offset can be provided, with a coarse stepped delay selection provided by the delay step selection circuitry and a fine delay selection provided by the delay-locked loop circuitry.

In some embodiments, said input circuitry comprises an input pad configured to receive said differential pair of data strobe signals from said memory, and said gate signal generation circuitry further comprises an additional pad and is configured to couple said data strobe gating signal via said additional pad in dependence on an additional pad selection signal. This enables variation in the input pad configured to receive the differential pair of data strobe signals to be accounted for, for example by user selection determining whether the additional pad selection signal is asserted or not.

In some embodiments said memory controller further comprises delay tracking circuitry configured repeatedly to perform an on-going delay tracking process during memory accesses which follow said training process, said on-going delay tracking process comprising adjusting said timing offset in dependence on said time ordering. The provision of the delay tracking circuitry enables the memory controller to adaptively adjust its configuration during on-going memory accesses by continuously monitoring the time ordering indicated by the phase detection circuitry and adjusting the timing offset to keep the data strobe gating signal and a logical data strobe signal closely aligned with one another. This enables the memory controller to maintain its calibration even whilst for example voltage and temperature variations occur.

In some such embodiments, said on-going delay tracking process comprises: decreasing a delay applied to said data strobe gating signal if said first transition of said logical data strobe signal is in advance of said first transition of said data strobe gating signal, and increasing a delay applied to said data strobe gating signal if said first transition of said data strobe gating signal is in advance of said first transition of said logical data strobe signal. Hence, the applied delay (as part of the timing offset) can be continually adjusted to bring the data strobe dating signal closer in alignment to the logical data strobe signal.

In some embodiments said memory is a DDR memory device, and may in particular be a DDR3 memory device. This is advantageous because the fly-by routing configuration used to propagate command signals between DDR3 memory modules means that the data strobe signal delay varies between each data bytelane of the memory controller (one data bytelane being provided for each DDR3 memory module), and furthermore DDR3 data modules are configured to operate at high clock frequencies. The present techniques enable an automated self calibration process to be carried out for a data strobe signal gate training even in the challenging environment of a DDR3 memory system.

Viewed from a second aspect the present invention provides a method of calibrating a memory controller comprising the steps of:

receiving a differential pair of data strobe signals from a memory and generating a logical data strobe signal in dependence on a voltage difference between said differential pair of data strobe signals; generating a data strobe gating signal, wherein said memory controller is configured to interpret said logical data strobe signal as valid when said data strobe gating signal is asserted; and performing a training process to determine a timing offset for said data strobe gating signal with respect to said logical data strobe signal, wherein said training process comprises a first phase in which a threshold voltage difference at which said generating said logical data strobe circuitry changes a logical state of said logical data strobe signal is increased, and a second phase in which said threshold voltage difference is not increased.

Viewed from a third aspect the present invention provides a memory controller comprising means for receiving a differential pair of data strobe signals from a memory and means for generating a logical data strobe signal in dependence on a voltage difference between said differential pair of data strobe signals;

means for generating a data strobe gating signal, wherein said memory controller is configured to interpret said logical data strobe signal as valid when said data strobe gating signal is asserted; and means for performing a training process to determine a timing offset for said data strobe gating signal with respect to said logical data strobe signal, wherein said training process comprises a first phase in which a threshold voltage difference at which said generating said logical data strobe circuitry changes a logical state of said logical data strobe signal is increased, and a second phase in which said threshold voltage difference is not increased.

BRIEF DESCRIPTION OF THE DRAWINGS

The present invention will be described further, by way of example only, with reference to embodiments thereof as illustrated in the accompanying drawings, in which.

DESCRIPTION OF THE PREFERRED EMBODIMENTS

Figure 1:
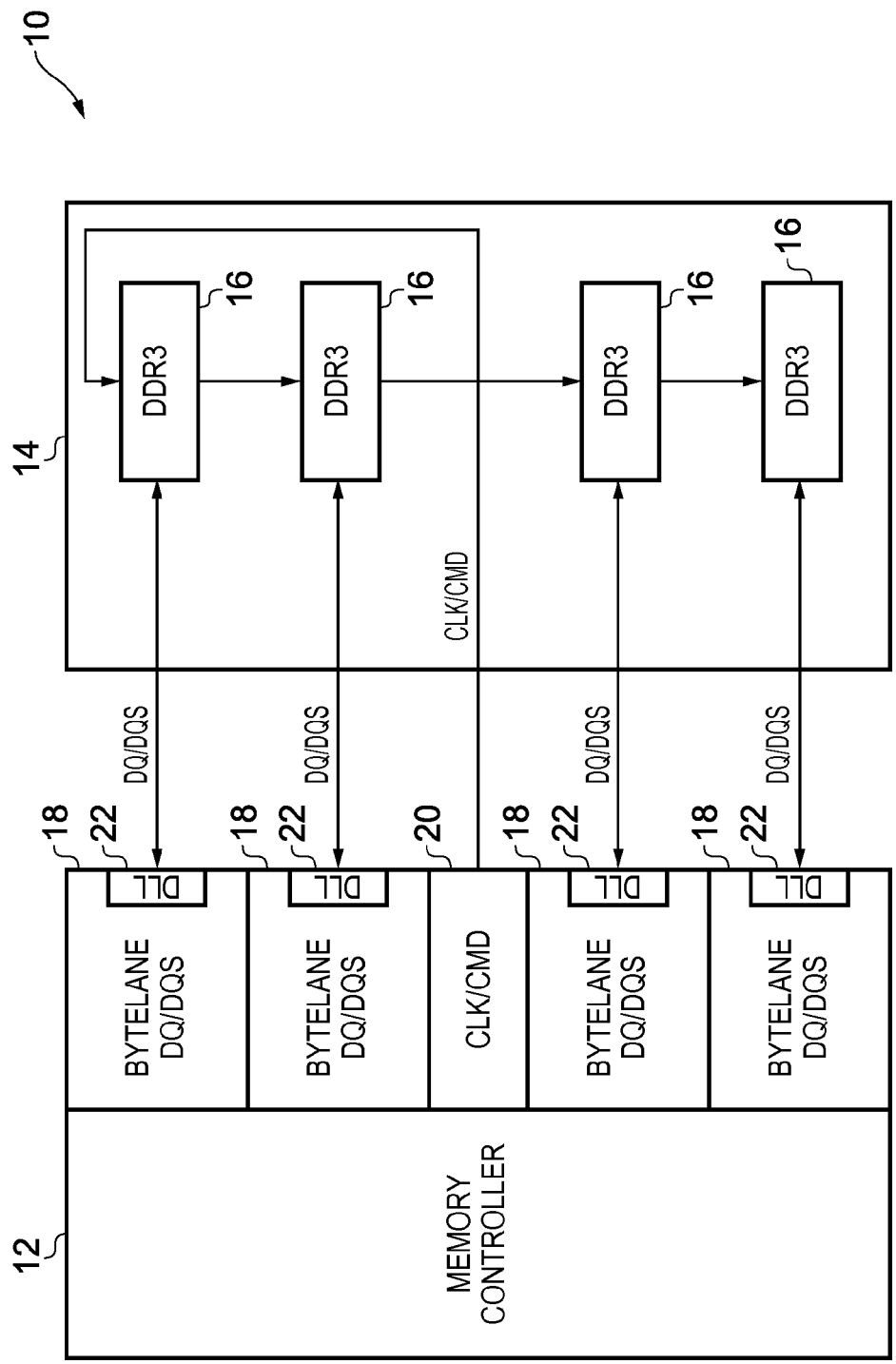
FIG. 1 schematically illustrates a memory system in one embodiment having a memory controller connected to a DDR3 memory device.

FIG. 1 schematically illustrates a DDR memory system 10, which generally comprises a memory controller integrated circuit 12 and a memory module integrated circuit 14. The memory module integrated circuit 14 comprises four DDR3 modules 16, each of which may be accessed in parallel by its own dedicated bytelane 18 provided as part of the memory controller integrated circuit 12. Each bytelane comprises DLL circuitry to enable it to adjust the timings of various signals which it receives or transmits. The memory controller integrated circuit 12 further comprises a clock/command (CLK/CMD) module 20 which is configured to transmit clock and command signals to the DDR3 modules 16. In the illustrated embodiment shown in FIG. 1, the CLK/CMD signals are transmitted between the DDR3 modules in a "fly-by" configuration to improve signal integrity (avoiding the reflections associated with a branching topology). Furthermore, the DDR memory system 10 is configured to operate at high frequency, for example, (at 2133 Mbps).

Accordingly, the memory controller 12 can cause data to be read from one of the DDR3 modules 16 by issuing appropriate command (CMD) signals via the CLK/CMD path (in association with the clock signal CLK which is also transmitted via that route), the requested data being returned from the corresponding DDR3 module via its associated DQ/DQS path to the corresponding bytelane 18 of the memory controller 12. Equally, the memory controller 12 can cause data to be written to one of the DDR3 modules 16 by issuing appropriate command (CMD) signals via the CLK/CMD path, the write data being transmitted from the respective bytelane 18 of the memory controller 12 to the corresponding DDR3 module via its associated DQ/DQS path.

In a read configuration, in order for the memory controller 12 to be able to correctly interpret the data transmitted as the DQ signal, the DQ signal is accompanied by a data strobe signal DQS, the transitions of which indicate the points at which the DQ signal should be sampled. In this read configuration, each bytelane 18 of the memory controller 12 is configured to generate a data strobe gating signal, wherein that bytelane 18 (under the general control of the memory controller 12) is configured to interpret the received DQS signal only as valid when the generated data strobe gating signal is asserted. The relative timing of the generated data strobe gating signal and the DQS signal received from the corresponding DDR3 module 16 is therefore important if the data transmitted as the DQ signal is to be correctly interpreted. The transitions of the DQS signal transmitted by each DDR module 16 indicates the points at which the data signal DQ transmitted from that DDR3 module 16 should be sampled. Accordingly, whilst the assertion of the data strobe gating signal should begin in advance of the first valid transition of the DQS signal, it should not be asserted too far in advance of that first valid transition, since stray noise on the DQS bus could otherwise be interpreted as a valid data strobe at the respected bytelane 18, causing spurious signals on the DQ bus to be interpreted as valid data. The memory controller 12 is therefore configured to perform a self-calibration process to train the timing of the data strobe gating signals in each bytelane 18 such that this relative timing is correct. This process will be described in more detail with reference to the following figures.

Figure 2:
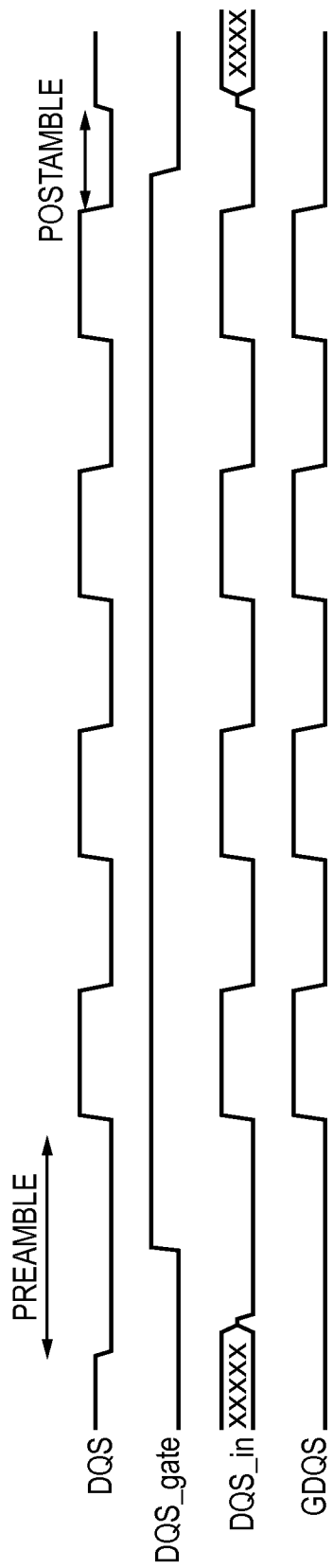
FIG. 2 shows example timings of a received data strobe signal, a data strobe gating signal, a logical data strobe signal and a gated data strobe signal.

FIG. 2 illustrates some idealised timings for some signals within the DDR3 memory system 10 shown in FIG. 1. Each DDR3 module 16 is configured to transmit its DQS signal as a sequence of predetermined length having a preamble portion and a postamble portion. Providing the preamble and postamble means that the respective bytelane 18 has a time window in which the imminent arrival of the first valid transition of the DQS signal can be expected and in which the last valid transition of the sequence is known to have occurred.

Each bytelane 18 is configured to generate a data strobe gating signal (DQS_gate) wherein each bytelane 18 (under the overall control of the memory controller 12 is configured to only interpret the DQS signal as valid when the DQS_gate signal is asserted). The DQS signal is received as a differential pair of data strobe signals from the respective DDR3 memory module 16, and accordingly each bytelane is configured to generate a logical data strobe signal DQS_in in dependence on a voltage difference between that differential pair of data strobe signals DQS. Hence, as can be seen in FIG. 2, whilst DQS is being driven by the respective DDR3 memory module 16 DQS_in directly represents the data strobe signal transmitted as the differential pair of data strobe signals DQS, however when DQS is not being driven by the respective DDR3 memory module 16 (prior to the preamble portion or after the postamble portion) termination of the DQS input pad at the bytelane 18 (discussed in more detail below) mean that the DQS input pad voltage is kept near a mid rail value and the logical data strobe signal generated can give an unknown result. However, the gated DQS signal (GDQS) determined by each bytelane 18 (under the general control of memory controller 12) only reflects transitions of DQS_in whilst DQS_gate is asserted such that when the DQ input is interpreted with respect to the GDQS signal, only the valid transitions of DQS are used to indicate sample points for that DQ signal. This arrangement is however reliant on the relative timing of DQS_gate and the received DQS signals being correct, in particular, the assertion of DQS_gate beginning within the preamble of DQS. The configuration of the memory controller, together with the training process it carries out, to achieve this is described with reference to the following figures.

Figure 3:
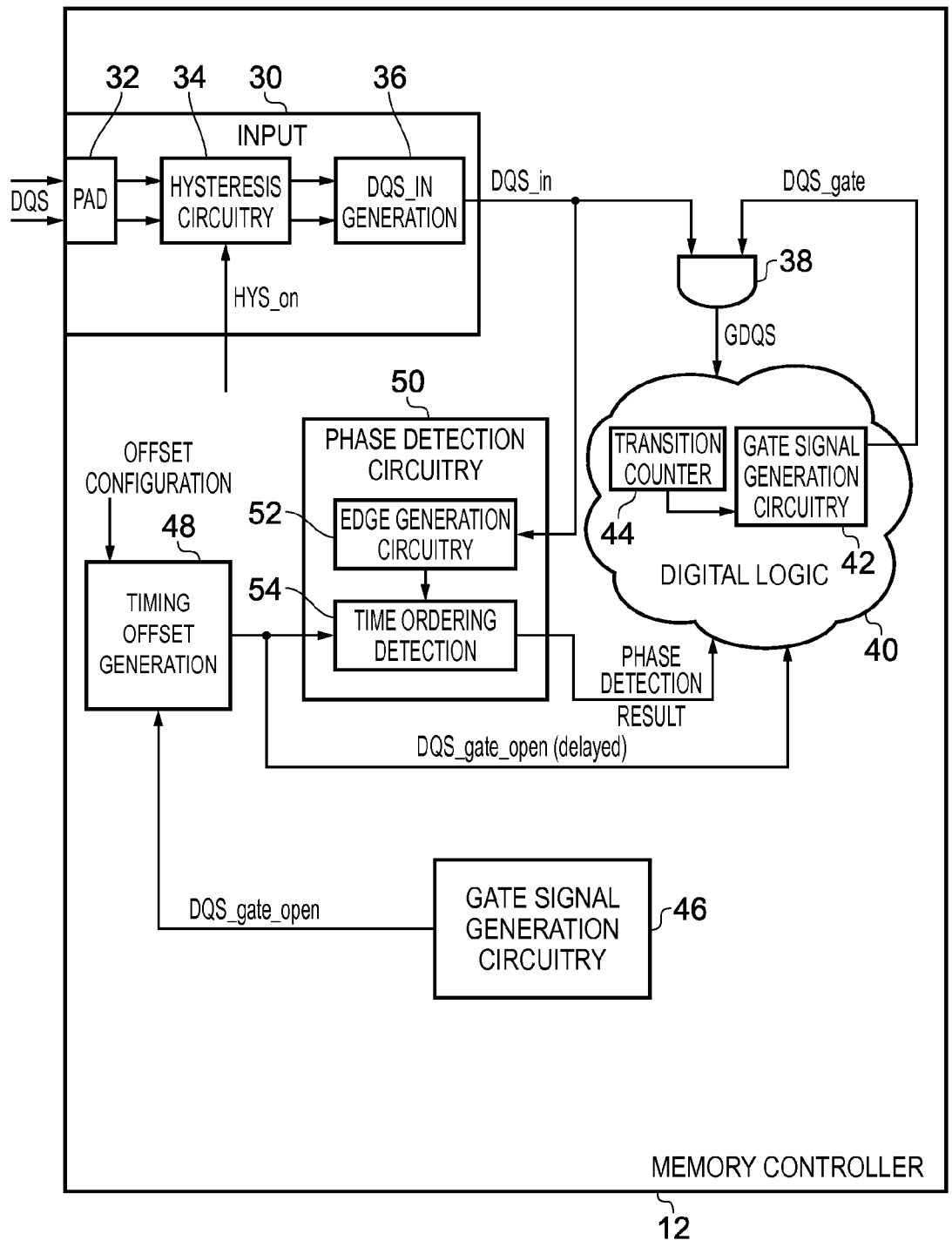
FIG. 3 schematically illustrates some components of a memory controller in one embodiment.

FIG. 3 schematically illustrates some components of memory controller 12 shown in FIG. 1. In particular, FIG. 3 schematically illustrates components which are to be found in each bytelane 18 of memory controller 12.

The differential pair of data strobe signals DQS are received at a pad 32 of input circuitry 30. These signals are passed via hysteresis circuitry 34 to DQS_in generation circuitry 36, which generates a logical data strobe signal on the basis of a voltage difference between the differential pair of data strobe signals DQS. The hysteresis circuitry 34 is in an active state when the control signal HYS_on is asserted and is inactive when HYS_on is not asserted. HYS_on is a digital signal generated in control logic within digital logic 40. DQS_in is provided as one input to AND gate 38 which takes as its other input the data strobe gating signal DQS_gate. The output of the AND gate 38 is the gated data strobe signal GDQS. GDQS is received by digital logic 40 which is in overall control of the illustrated components in FIG. 3 and of which only two specific components are schematically illustrated here for clarity, the first being gate signal generation circuitry 42 which generates the DQS_gate signal on the basis of the DQS_gate_open signal generated by gate signal generation circuitry 46 and to which a variable delay has been applied by timing offset generation circuitry 48. Digital logic 40 further comprises transition counter 44, which is configured to count the number of transitions of DQS after the preamble, such that when a predetermined number of transitions have occurred (and known to be transmitted by a DDR3 memory module 16 in a predetermined sequence—in this case, four clock cycles, or eight beats in length) the gate signal generation circuitry 42 can deassert DQS_gate when the last valid transition of DQS has occurred and at the latest during the postamble of DQS. Phase detection circuitry 50 is also provided which receives both the logical data strobe signal (DQS_in) and the delayed DQS_gate_open signal from timing offset generation circuitry 48 as inputs. DQS_in is received by edge generation circuitry 52, whilst the delayed DQS_gate_open signal is received by time ordering detection circuitry 54. The edge generation circuitry 52 is configured to generate an edge signal with a first value before the first valid transition of DQS_in and a second value after that transition. In the illustrated embodiment, edge generation circuitry 52 is configured to generate the edge signal which it passes to time ordering detection circuitry 54 as a logical "0" before that first transition, and a logical "1" after that first transition. The time ordering detection circuitry 54 generates a phase detection result which is passed to digital logic 40 and indicates a time ordering of the transition between the first and second value of the edge signal generated by edge generation circuitry 52 and the first transition of the (delayed) DQS_gate_open signal. On the basis of this received phase detection result, the digital logic 40 can configure the offset to be applied by timing offset generation circuitry 48 in order to correctly align DQS_gate_open with DQS in. Digital logic 40 also generates the HYS_on signal which determines whether the hysteresis circuitry 34 is active (in the first phase of the training process) or inactive (in the second phase of the training process).

Figure 4:
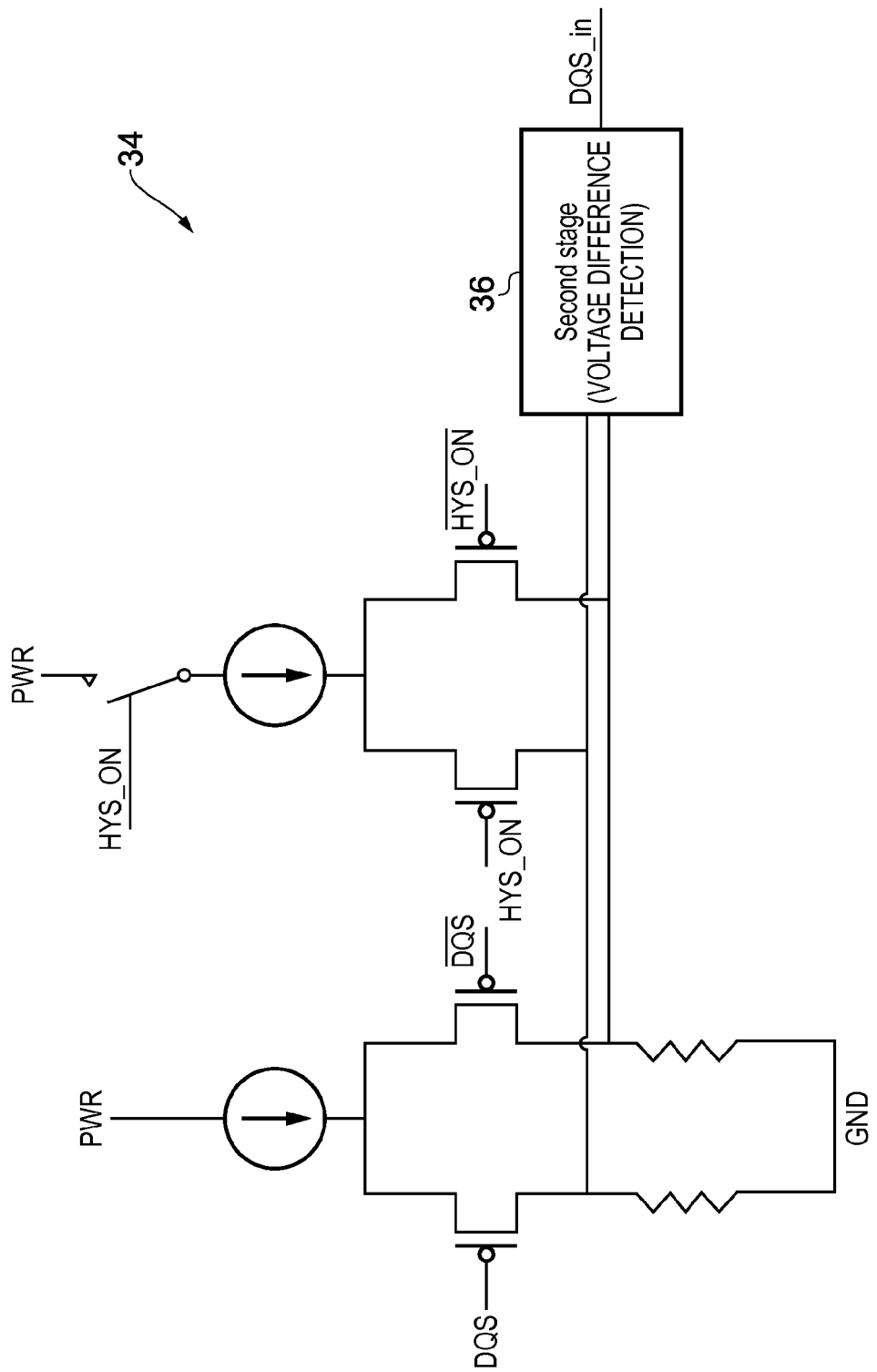
FIG. 4 schematically illustrates in more detail the hysteresis circuitry of the memory controller shown in FIG. 3.

FIG. 4 schematically illustrates in more detail the hysteresis circuitry 34 shown in FIG. 3. As mentioned above, whilst the DQS bus is tri-stated (in a high impendence state), any stray noise can be detected as a logic level change by the memory controller (PHY) input receiver causing a wrong detection of the preamble and hence generation of a wrongly timed DQS gating signal. To avoid stray noise during this tri-state condition, on-die-termination (ODT) is enabled prior to the training process being carried out and remains on throughout. The termination drives the DQS bus strongly which ensures that stray PCB noise on the DQS bus doesn't produce a logic level change, however the termination also keeps the DQS pad 32 voltage near mid rail and a conventional DQS receiver input pad 32 could give an unknown result. To avoid this indeterministic IO output, the signal HYS_on is asserted during a first phase of the training process such that the output of the second stage (which detects the voltage difference between DQS and DQS bar signals (i.e. DQS_in generation circuitry 36 of FIG. 3)) will remain low unless approximately 75 mV differential voltage is present. This helps to generate a clean input signal to the rest of the circuitry of FIG. 3. Activation of the hysteresis circuitry 34 does however also slightly disturb the timing of the DQS_in signal and hence a second phase of the training process (in which HYS_on is deasserted to deactivate hysteresis circuitry 34) is carried out to allow a fine tuning of the alignment between DQS_gate_open delayed and DQS_in. The first and second stages of the training process will be described in more detail in the following.

Figure 5:
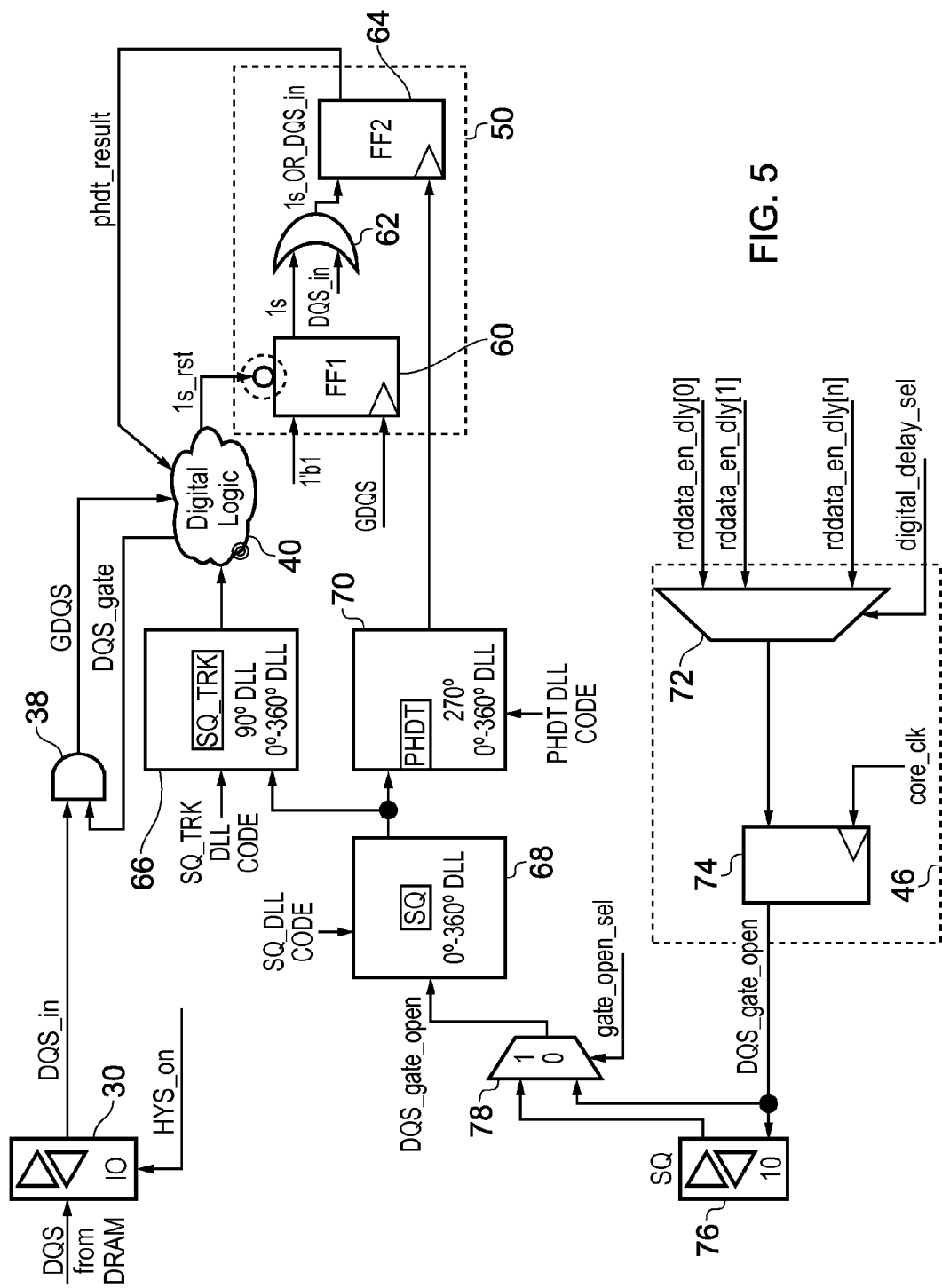
FIG. 5 schematically illustrates more detail of some components of the memory controller shown in FIG. 3.

FIG. 5 schematically illustrates in more detail some of the components shown in FIG. 3. Some components shown in FIG. 5 are as described with reference to FIG. 3, given the same reference numerals in FIG. 5 and not described further here, for example input circuitry 30 and AND gate 38. The phase detection circuitry 50 comprises a first flop 60 (FF1), an OR gate 62 and a second flop 64 (FF2). Here, the flop 60 is playing the role of the edge generation circuitry 52, by receiving a fixed logical "1" as its input and being clocked by the GDQS signal. This means that the one shot pulse is it generates corresponds (slightly delayed by clocking and signalling delays) to the first valid transition of the received DQS signal. Note also that the reset of flop 60 is controlled by the 1s_rst signal received from digital logic 40, which enables the digital logic 40 to enable flop 60 during a first phase of the training process and to turn flop 60 off in a second phase of the training process, as will be described in more detail below. The one shot pulse 1s generated by flop 60 is received as one input of OR gate 62 whilst its other input is provided by DQS_in. Accordingly, the output of OR gate 62, 1s_OR_DQS_in corresponds to the signal 1s whilst flop 60 is active, and corresponds to DQS_in when flop 60 is deactivated. This provides the input to flop 64 (FF2) which is playing the role of time ordering detection circuitry 54 of FIG. 3. Flop 64 is clocked by the DQS_gate_open signal (as delayed by the delay units 68 and 70 as will be described in more detail below) such that before DQS_gate_open is asserted, the output of flop 64 (phdt_result) is in an indeterminate state, whilst once DQS_gate_open is asserted phdt_result takes a low value if the transition of DQS_gate_open is in advance of the transition of 1 s_OR_DQS_in, or phdt_result will take a high value if the transition DQS_gate open is after the transition of 1s_OR_DQS_in.

The DQS_gate_open signal is generated in three stages in FIG. 5. Firstly, the gate signal generation circuitry 46 of FIG.

3 is provided by multiplexer 72 and flop 74 in FIG. 5. Multiplexer 72 receives a number of different digital delay signals rddata_en_dly[n] which provide a coarse, digital delay selection for the DQS_gate_open signal and the selection between the possible delays is provided by the selection signal digital_delay_sel (a digital signal generated by control logic within digital logic 40). The output of multiplexer 72 is received as the input of flop 74 which is clocked by the core clock core_clk to thus generate the DQS_gate_open signal. This signal can then take one of two paths depending on the setting of the selection signal gate_open_sel (another digital signal generated by control logic within digital logic 40). This gate_open_sel signal enables the system user to specify whether the DQS_gate_open signal passes via the SQ IO pad provided to match the DQS IO pad 30, and hence the gate_open_sel signal and multiplexer 78 enable the system user to determine the effect of (and if necessary compensate for) DQS pad 30 variation. The final stage of the DQS_gate_open signal is via the delay-locked loop logic units 66, 68 and 70, which play the role of the timing offset generation circuitry 48 shown in FIG. 3. The SQ DLL 68 provides a fine delay selection adjusted during the training process to align DQS_gate_open with DQS_in (or rather GDQS). The full range of SQ DLL 68 (i.e.)0-360° corresponds to one step of the coarse digital delay provided by multiplexer 72. Hence a large range of delay may be provided with fine increments by the combination of multiplexer 72 and SQ DLL 68, wherein when the SQ DLL code controlling the delay applied by the SQ DLL 68 reaches its maximum, it is reset and one step of digital delay is applied by incrementing digital_delay_sel. After the training process, during normal memory access, the DLL unit 66 and 70 provide dynamic adjustment to the delay applied to DQS_gate_open, such that the memory controller can adapt for changes in voltage and temperature. The delay applied by these dynamic adjustment DLL units are configured to be at 180° phase with one another such that DQS_gate_open can be used by flop 64 to accurately align with the first valid transition of the received DQS signal, whilst the DQS_gate signal generated by digital logic 40 can be placed in the preamble of the DQS signal (see FIG. 2). Accordingly, the SQ_TRK DLL code which controls DLL 66 and the PHDT DLL code which controls DLL 70 (each generated by digital logic 40) are adjusted in strict synchronisation with one another.

Figure 6A:
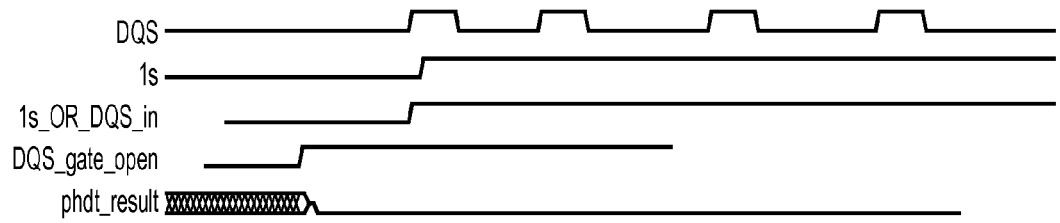
FIGS. 6A, 6B and 6C illustrates the relative timings of various signals within a memory controller in one embodiment as its proceeds from the first phase of the training process to the second phase.
Figure 6B:
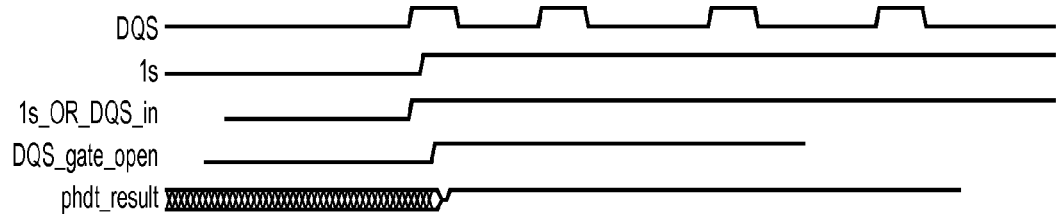
Figure 6C:
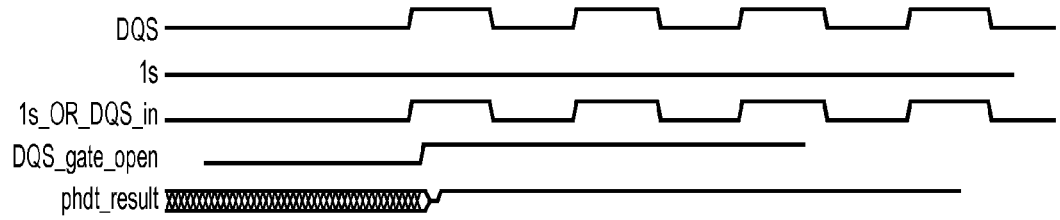

FIGS. 6A, 6B and 6C show some relative timings of the above discussed signals. FIG. 6A shows the signal phdt_result during the first phase of the DQS gate training process. Comparing the signal DQS to that shown in FIG. 2, it can be seen that the high pulse of DQS is reduced because the hysteresis is on. Once DQS_gate_open is asserted, phdt_result takes a low value because DQS_gate_open is in advance of the signal 1s_OR_DQS_in (whose transition indicates the first valid transition of the DQS signal). Turning to FIG. 6B, the adjustment of the timing offset applied by the coarse digital delay selection selected by multiplexer 72 in FIG. 5 and the fine delay selection applied by SQ DLL 68 in FIG. 5 has resulted in a delay being applied to DQS_gate_open which has placed its transition after that of 1s_OR_DQS_in and hence phdt_result then a takes a high value. In FIG. 6C the signals are shown in the second phase of the DQS gate training process in which the hysteresis circuit has been switched off, and it can be seen (compared to FIG. 2) that the high pulse of DQS is back to normal. Now, in the second phase of the DQS gate training process the digital logic 40 turns off flop 60 by keeping 1s_RST low and hence the signal 1s is held at a low value. Hence 1s_OR_DQS_in is then given by DQS_in. DQS_gate_open in the situation illustrated in FIG. 6C then follows the first transition of DQS_in (and is now closely enough aligned with DQS_in that the further transitions of DQS_in do not interfere with the training process) and phdt_result takes a high value, indicating to the digital logic 40 that the delay applied to DQS_gate_open should be reduced to more closely align the two first transitions.

Figure 7:
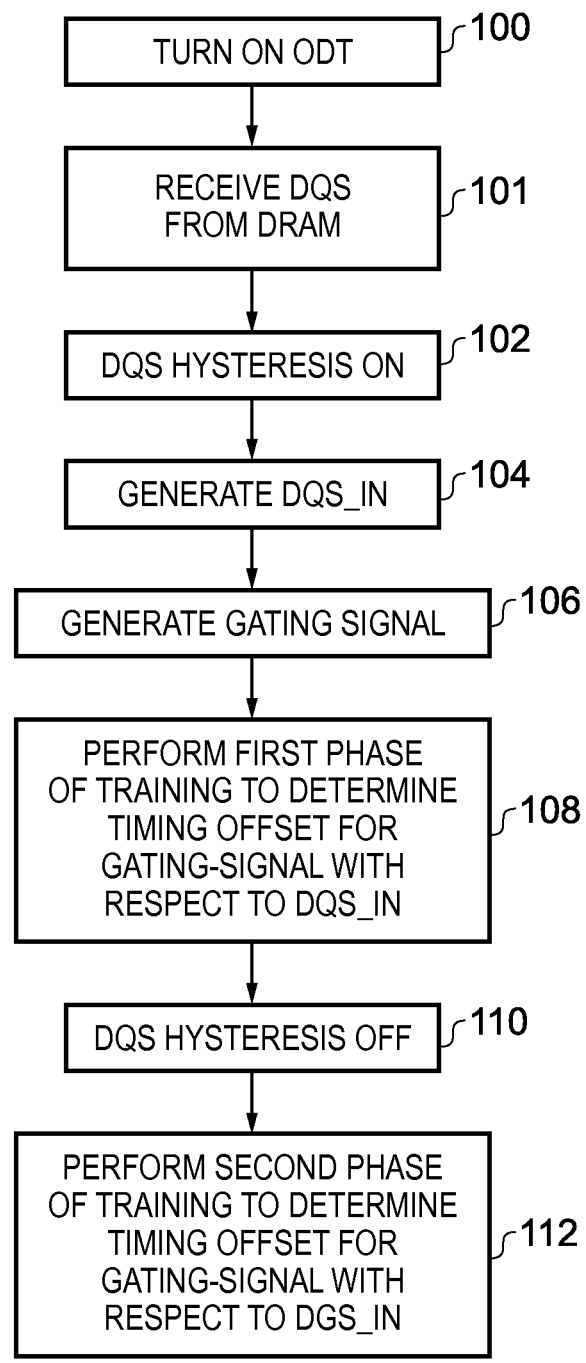
FIG. 7 schematically illustrates a series of steps which are taken in one embodiment of the memory controller to carry out its self calibration.

FIG. 7 schematically illustrates a high level view of the training process carried out by the memory controller. At a first step 100, the on-die termination is switched on and at step 101 the DQS signal is initially received from the DRAM. At this initial stage the DQS hysteresis is switched on (step 102). The logical data strobe signal DQS_in is generated (step 104) and at step 106 the initial gating signal is generated. A first phase of the training process is then carried out (step 108) to determine a timing offset for the gating signal with respect to DQS_in. Then (step 110) the DQS hysteresis is switched off, and at step 112 a second phase of the training process is carried out to determine the timing offset for the gating signal with respect to DQS in, in the knowledge that the alignment of the two will have been slightly disturbed by switching off the DQS hysteresis.

Figure 8:
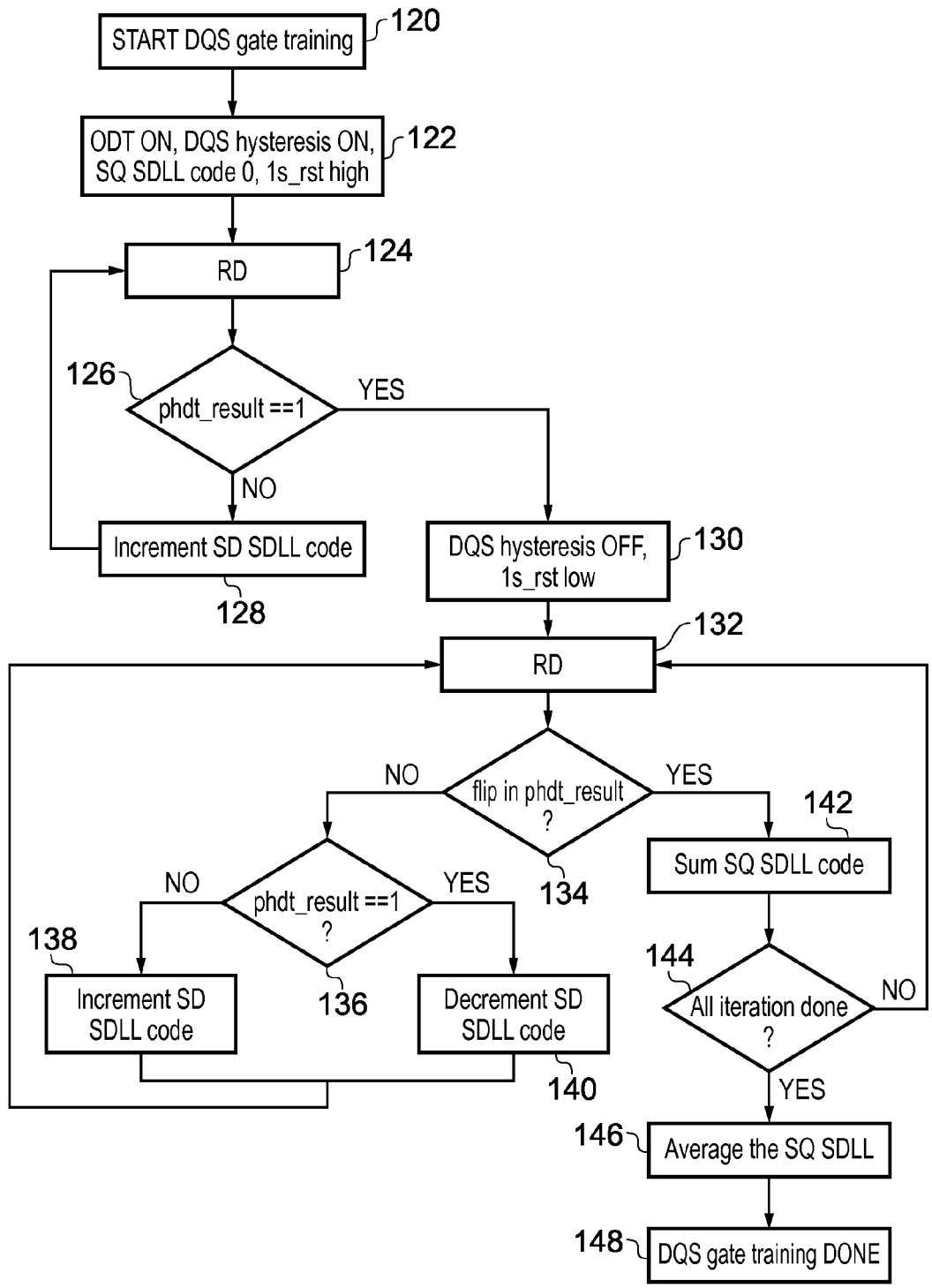
FIG. 8 schematically illustrates in more detail some steps which are taken in one embodiment in which a memory controller carries out its self calibration process.

Further detail of the steps carried out in the DQS gate training process are shown in FIG. 8. The DQS gate training process begins at step 120. To set up the first phase of the training process, at step 122 the on die termination is switched on, the DQS hysteresis is switched on, the SQ SDLL code is set to zero and the 1s_rst signal is set high. Then at step 124 an iterative process of the first phase is started by iterating a read command (RD) from the memory controller to the respective memory module and at step 126 it is determined if the resulting phdt_result value is 1. The configuration setup at step 122 is such that it is known that when starting the first phase of the training process, the DQS_gate_open signal will be in advance of the first valid transition of the DQS signal, accordingly, if phdt_result is found to be 0 at step 126 then the flow proceeds to step 128 where the SD SDLL code is incremented to delay DQS_gate_open signal and thus bring the transition of DQS_gate_open closer to the first valid transition of DQS. The flow then returns to step 124 where a further read command is issued to the memory module. This iterative process then continues via step 124, 126 and 128 until it is determined at step 126 that phdt_result is 1 meaning that the transition of DQS_gate_open is now after the transition of the first valid transition of DQS, and the flow proceeds to step 130. The first phase of the training process is now completed and the DQS hysteresis is switched off and 1s_rst is set to low. The second phase of the training process then begins at step 132 with a further read command being issued to the memory module. Then at step 134, it is determined if a flip has occurred in the phdt_result value. If it has not, then the flow proceeds to step 136 where it is determined if the phdt_result value is currently 1. If it is not then the first transition of DQS_gate_open currently precedes the first valid transition of DQS and at step 138 the SD SDLL code is incremented to increase the delay applied to DQS_gate_open, whereas if at step 136 it is determined that the phdt_result value is currently 1 then at step 140 the SD SDLL code is decremented to decrease the delay being applied to DQS_gate_open. The flow then returns to step 132 for a further read command to be issued to the memory module. Once it is determined at step 134 that a flip in the phdt_result value has occurred, then it is known that in this second phase of the DQS_gate_training process the DQS_gate_open signal is now very closely aligned with the first valid transition of the DQS signal and at step 142 the current SQ SDLL code is added to a running sum. Then at step 144 it is determined if all iterations of this second phase of the training process have been completed, and if they have not then the flow returns to step 132. Once all iterations have been done then at step 146 the summed SQ SDLL codes are averaged over the number of iterations carried out to give the final SQ SDLL code to be applied. The DQS_gate training process is then complete at step 148.

Figure 9A:
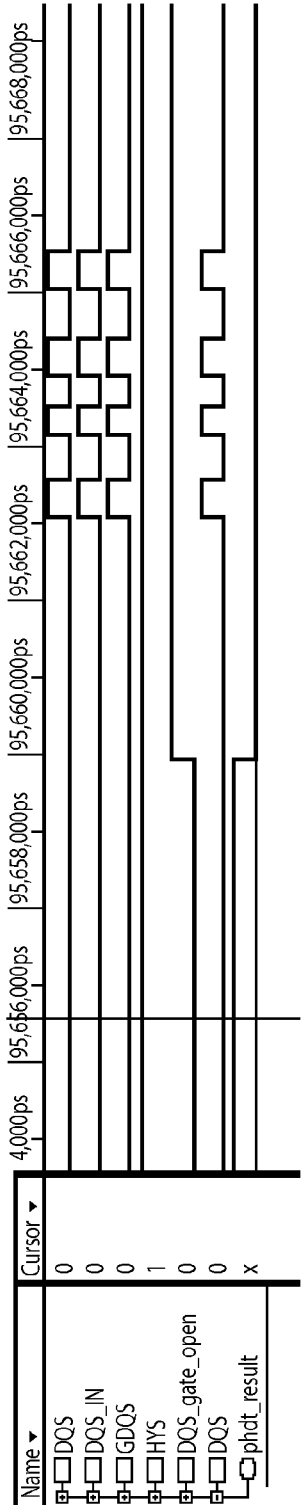
FIGS. 9A, 9B and 9C show simulation results for various signals in a memory controller in one embodiment as a memory controller carries out its self calibration training process.
Figure 9B:
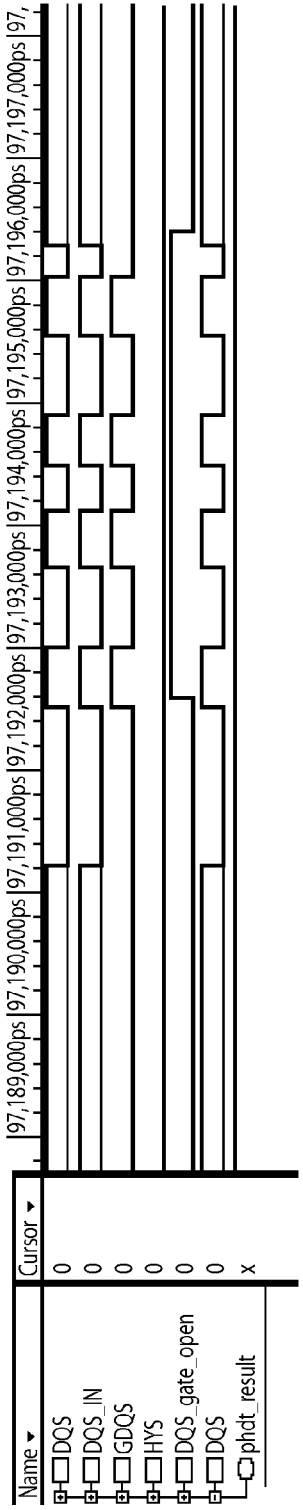
Figure 9C:
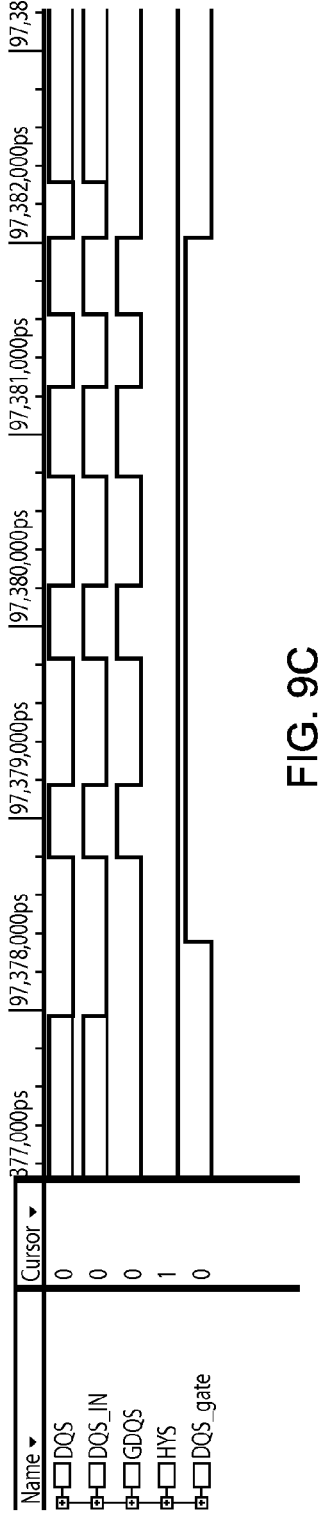

FIGS. 9A, 9B and 9C illustrate the result of a simulation of the relevant signals as the DQS_gate training process is carried out. FIG. 9A shows the initial situation before the first phase of the training process has been carried out, in which the DQS_gate_open signal is asserted comfortably in advance of the first valid transition of the DQS signal. FIG. 9B then illustrates the situation at the conclusion of the first phase training process after the DQS hysteresis has been turned off. It can be seen that the first transition of DQS_gate_open is now closely aligned with the first valid transition of DQS. FIG. 9C shows the final DQS_gate signal after completing the training process wherein the first transition of this signal (asserting DQS_gate such that DQS will then be interpreted as valid) falls in the middle of the preamble of the DQS signal. Furthermore, during the training process the memory controller has counted the number of transitions in the DQS sequence transmitted by the memory module (which is known to comprise eight beats) and the DQS_gate signal is then switched off at the point which aligns with the last beat of the DQS sequence, at the beginning of its postamble.

Figure 10:
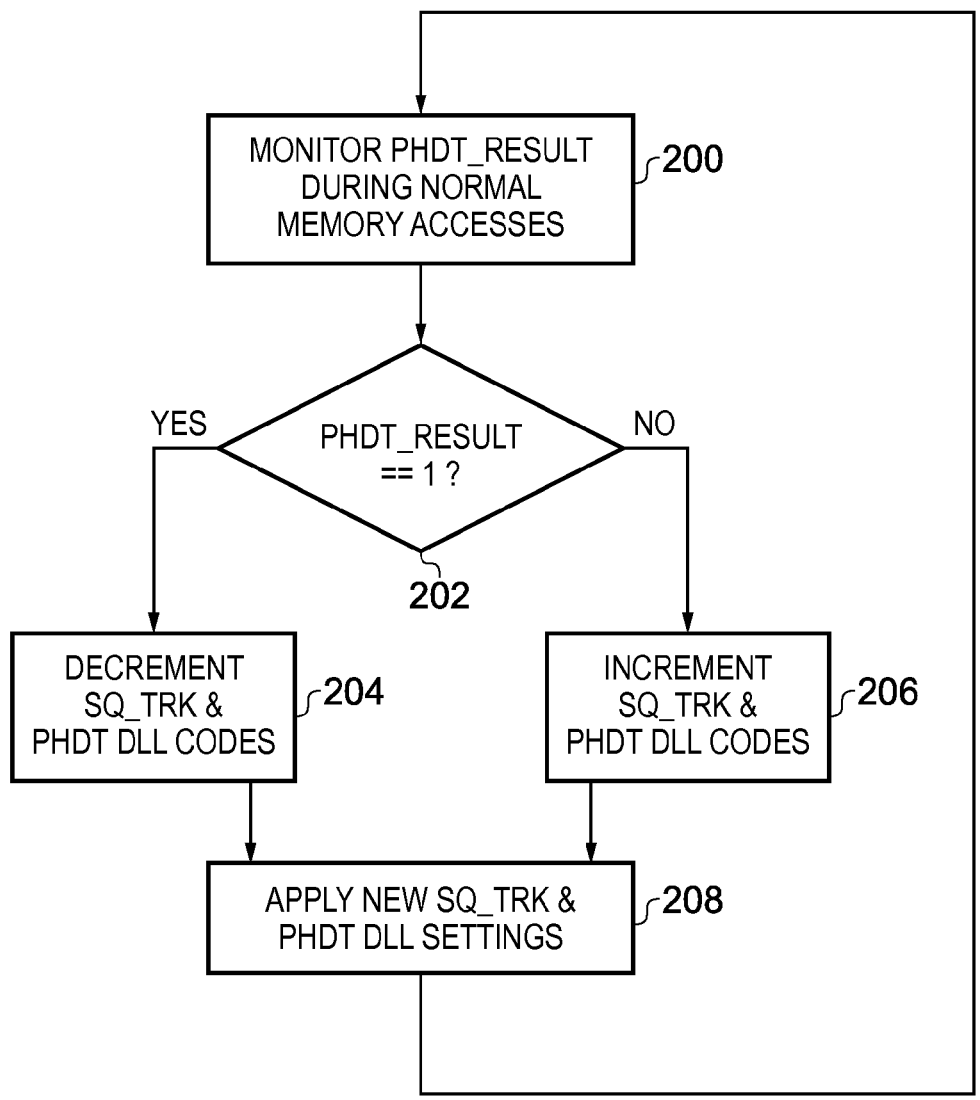
FIG. 10 schematically illustrates a series of steps which are taken in one embodiment in which a memory controller carries out an adaptive process during normal memory accesses to keep its calibration accurate.

As mentioned above, the memory controller is also configured to carry out dynamic tracking of the relative timing of the DQS_gate signal by means of the SQ_TRK and PHDT DLL units 66 and 70. An example sequence of steps in this iterative process are schematically set out in FIG. 10. At step 200 it is indicated that the phdt_result value is monitored during normal memory accesses. At step 202 it is determined if the phdt_result is 1. If it is then the flow proceeds to step 204, since this indicates that the transition of the DQS_gate_open signal is currently after the first valid transition of the DQS signal (as in the situation illustrated in FIG. 6C) and the SQ_TRK and PHDT DLL codes are decremented to reduce the delay applied to DQS_gate_open. Conversely, if it is determined that step 202 that the phdt_result value is not currently 1 (i.e. it is 0) then the flow proceeds to step 206 where the SQ_TRK and PHDT DLL codes are incremented to increase the delay applied to DQS_gate_open. Then at step 208 the new SQ_TRK and PHDT DLL settings are applied by units 66 and 70 and the flow returns to step 200. This iterative process continues to continually monitor the relative phase of DQS_gate_open and the first valid transition of DQS and adjust the delay being applied to DQS_gate_open to move it in the direction of the first valid transition of DQS. In a stable state where there is no temperature and voltage variation the DQS_gate_open signal will therefore be kept in an oscillating configuration around the first valid transition of the DQS signal the swing of which is dictated by the size of each increment of the SQ_TRK and PHDT DLL codes. However, if any temperature or voltage variation is experienced, causing the relative timing of the two signals to drift with respect to one another then this iterative process corrects for that variation.

Although particular embodiments of the invention have been described herein, it will be apparent that the invention is not limited thereto, and that many modifications and additions may be made within the scope of the invention. For example, various combinations of the features of the following dependent claims could be made with the features of the independent claims without departing from the scope of the present invention.

We claim:
1. A memory controller comprising:
input circuitry configured to receive a differential pair of data strobe signals from a memory, said input circuitry configured to generate a logical data strobe signal in dependence on a voltage difference between said differential pair of data strobe signals;
hysteresis circuitry configured, when switched to an active state, to increase by a predetermined offset a threshold voltage difference at which said input circuitry is configured to change a logical state of said logical data strobe signal; and
gate signal generation circuitry configured to generate a data strobe gating signal, wherein said memory controller is configured to interpret said logical data strobe signal as valid when said data strobe gating signal is asserted,
wherein said memory controller is configured to perform a training process to determine a timing offset for said data strobe gating signal with respect to said logical data strobe signal,
wherein said training process comprises a first phase in which said hysteresis circuitry is in said active state and a second phase in which said hysteresis circuitry is not in said active state.

2. The memory controller as claimed in claim 1 further comprising:
phase detection circuitry configured to determine a time ordering of a first transition of said logical data strobe signal and a first transition of said data strobe gating signal.

3. The memory controller as claimed in claim 2, wherein said phase detection circuitry comprises edge generation circuitry, said edge generation circuitry configured to generate an edge signal with a first value before said first transition of said logical data strobe signal and to generate said edge signal with a second value after said first transition of said logical data strobe signal.

4. The memory controller as claimed in claim 3, wherein said phase detection circuitry is configured to determine said time ordering with reference to said edge signal and said data strobe gating signal.

5. The memory controller as claimed in claim 2, wherein said memory controller is configured to receive said differential pair of data strobe signals as a sequence of predetermined length, and said memory controller is configured to perform a timing adjustment process comprising instructing said memory to transmit said sequence and adjusting a timing offset for said data strobe gating signal to reduce a time difference between said first transition of said logical data strobe signal and said first transition of said data strobe gating signal, wherein said memory controller is configured to repeat said timing adjustment process until said time ordering inverts.

6. The memory controller as claimed in claim 2, wherein said memory controller is configured to begin said first phase with said first transition of said data strobe gating signal in advance of said first transition of said logical data strobe signal.

7. The memory controller as claimed in claim 5, wherein said memory controller is configured to perform said timing adjustment process in said first phase of said training process and said memory controller is configured to adjust said timing offset by incrementing said timing offset for said data strobe gating signal.

8. The memory controller as claimed in claim 5, wherein said memory controller is configured to perform said timing adjustment process in said second phase of said training process and said memory controller is configured to adjust said timing offset by incrementing said timing offset for said data strobe gating signal in a direction dependent on said time ordering.

9. The memory controller as claimed in claim 8, wherein said memory controller is configured to repeat said second phase for a plurality of iterations and to determine an averaged timing offset in dependence on said timing offset determined at each iteration of said plurality of iterations.

10. The memory controller as claimed in claim 1, wherein said memory controller is configured to receive said differential pair of data strobe signals as a sequence of predetermined length, wherein said sequence comprises a preamble portion, said gate signal generation circuitry is further configured to generate a delayed data strobe gating signal, wherein said memory controller is configured to interpret said logical data strobe signal as valid when said delayed data strobe gating signal is asserted,
and said memory controller is configured to determine said timing offset such that a first transition of said delayed data strobe gating signal occurs within said preamble portion.

11. The memory controller as claimed in claim 10, wherein said sequence comprises a postamble portion, and said gate signal generation circuitry is further configured to generate said delayed data strobe gating signal such that a last transition of said delayed data strobe gating signal is aligned with a start of said postamble portion.

12. The memory controller as claimed in claim 11, wherein said memory controller is configured to count a number of transitions of said sequence between said preamble portion and said postamble portion.

13. The memory controller as claimed in claim 1, further comprising delay circuitry configured to provide said timing offset, said delay circuitry comprising delay-locked loop circuitry.

14. The memory controller as claimed in claim 13, wherein said delay circuitry further comprises delay step selection circuitry configured to select a delay step for said timing offset from plural delay steps, wherein each delay step of said plural delay steps corresponds to a delay range of said delay-locked loop circuitry.

15. The memory controller as claimed in claim 1, wherein said input circuitry comprises an input pad configured to receive said differential pair of data strobe signals from said memory, and said gate signal generation circuitry further comprises an additional pad and is configured to couple said data strobe gating signal via said additional pad in dependence on an additional pad selection signal.

16. The memory controller as claimed in claim 2, wherein said memory controller further comprises delay tracking circuitry configured repeatedly to perform an on-going delay tracking process during memory accesses which follow said training process, said on-going delay tracking process comprising adjusting said timing offset in dependence on said time ordering.

17. The memory controller as claimed in claim 16, wherein said on-going delay tracking process comprises:
decreasing a delay applied to said data strobe gating signal if said first transition of said logical data strobe signal is in advance of said first transition of said data strobe gating signal, and
increasing a delay applied to said data strobe gating signal if said first transition of said data strobe gating signal is in advance of said first transition of said logical data strobe signal.

18. The memory controller as claimed in claim 1, wherein said memory is a DDR3 memory device.

19. A method of calibrating a memory controller comprising the steps of:
receiving a differential pair of data strobe signals from a memory and generating a logical data strobe signal in dependence on a voltage difference between said differential pair of data strobe signals;
generating a data strobe gating signal, wherein said memory controller is configured to interpret said logical data strobe signal as valid when said data strobe gating signal is asserted; and
performing a training process to determine a timing offset for said data strobe gating signal with respect to said logical data strobe signal,
wherein said training process comprises a first phase in which a threshold voltage difference at which said generating said logical data strobe circuitry changes a logical state of said logical data strobe signal is increased, and a second phase in which said threshold voltage difference is not increased.

20. A memory controller comprising:
means for receiving a differential pair of data strobe signals from a memory and means for generating a logical data strobe signal in dependence on a voltage difference between said differential pair of data strobe signals;
means for generating a data strobe gating signal, wherein said memory controller is configured to interpret said logical data strobe signal as valid when said data strobe gating signal is asserted; and
means for performing a training process to determine a timing offset for said data strobe gating signal with respect to said logical data strobe signal,
wherein said training process comprises a first phase in which a threshold voltage difference at which said generating said logical data strobe circuitry changes a logical state of said logical data strobe signal is increased, and a second phase in which said threshold voltage difference is not increased.

* * * * *